United States Patent
Ami et al.

(10) Patent No.: US 6,248,960 B1
(45) Date of Patent: Jun. 19, 2001

(54) CERAMICS SUBSTRATE WITH ELECTRONIC CIRCUIT AND ITS MANUFACTURING METHOD

(75) Inventors: Norihiro Ami; Masahide Okamoto, both of Yokohama; Shosaku Ishihara, Chigasaki; Minoru Tanaka, Yokohama; Mutsumi Horikoshi, Machida; Akihiro Yasuda, Hadano, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/501,683

(22) Filed: Feb. 10, 2000

(30) Foreign Application Priority Data

Feb. 19, 1999 (JP) .................................................. 11-041042

(51) Int. Cl.$^7$ .......................... H01R 12/04; H01R 12/32; H05K 1/11
(52) U.S. Cl. .......................... 174/264; 174/258; 174/262; 361/302; 361/321.5; 428/34.5; 428/209; 428/210; 428/220; 428/901; 156/89.12; 156/89.18
(58) Field of Search ................................ 174/264, 257, 174/258, 262; 361/321.5, 302, 795; 428/901, 209, 210, 220, 34.5, 344; 156/89.18, 89.12; 501/32

(56) References Cited

U.S. PATENT DOCUMENTS

| 4,465,727 | * | 8/1984 | Fujita et al. ........................ 428/138 |
| 5,229,549 | * | 7/1993 | Yamakawa et al. ................... 174/262 |
| 5,230,846 | * | 7/1993 | Tamhankar et al. ............... 156/89.18 |
| 5,283,104 | * | 2/1994 | Aoude et al. .......................... 428/195 |
| 5,296,189 | * | 3/1994 | Kang et al. ............................. 419/9 |
| 5,340,947 | * | 8/1994 | Credle et al. .......................... 174/262 |
| 5,362,551 | * | 11/1994 | Okamoto et al. ...................... 428/210 |
| 5,468,445 | * | 11/1995 | Casey et al. ............................ 419/19 |
| 5,496,619 | * | 3/1996 | Itagaki et al. .......................... 428/209 |
| 5,525,761 | * | 6/1996 | David et al. ............................ 174/257 |
| 5,683,791 | * | 11/1997 | Horiuchi et al. ....................... 428/210 |
| 5,922,245 | * | 7/1999 | Mohri et al. ........................... 252/512 |

FOREIGN PATENT DOCUMENTS

| 8-227855 | | 8/1994 | (JP) . |
| 07094840 | * | 4/1995 | (JP) . |
| 07235215 | * | 9/1995 | (JP) . |
| 8-17217 | | 1/1996 | (JP) . |
| 8-18232 | | 1/1996 | (JP) . |
| 8-279666 | | 10/1996 | (JP) . |
| 8-333157 | | 12/1996 | (JP) . |

* cited by examiner

Primary Examiner—Albert W. Paladini
Assistant Examiner—I. B. Patel
(74) Attorney, Agent, or Firm—Antonelli, Terry, Stout & Kraus, LLP

(57) ABSTRACT

In a ceramic wiring board which comprises a copper via, breaks and defects of via interconnections resulting from enlargement of copper particles in the interior of the via during sintering, are prevented. For this purpose, alumina of mean particle diameter from 1 μm to 4 μm is disposed in the interior of the via interconnection after sintering at an average interval of 7.4 μm or less.

9 Claims, 5 Drawing Sheets

50 μm

POSITION

50 μm

CERAMICS SUBSTRATE WITH ELECTRONIC CIRCUIT AND ITS MANUFACTURING METHOD

BACKGROUND OF THE INVENTION

This invention relates to a ceramic multilayer wiring board, in particular a ceramic wiring board using copper as a via interconnection, to a ceramic multilayer wiring board having a suitable post-sintering via microstructure, and to a copper paste for obtaining this microstructure.

Ceramic wiring boards having a multilayer structure are used in electrical devices where modular wiring substrates are required for high integration and high-speed processing, due to the need for making fine interconnections. Copper is the material of choice for these interconnections due to its low specific resistance.

As substrate used as a support for interconnections, an inorganic material having glass as its principal component is used as the glass can be sintered at the same time as the copper of the interconnections. A borosilicate glass suitable for substrates is described in detail in Japanese Patent Laid-Open No. Hei 8-333157. Fillers which may be added are disclosed in Japanese Patent Laid-Open No. Hei 8-18232.

Here, the method of manufacturing the substrate will be briefly described.

Generally, the inorganic material is supplied in the form substrate is manufactured by the well-known green sheet method. This method consists of the following steps.
(1) Making a slurry of the powdered inorganic material using an organic binder and a solvent.
(2) Forming this slurry into the shape of a sheet.
(3) Opening vias (through holes) in the sheet.
(4) Embedding an interconnection paste in the vias.
(5) Forming an interconnection or other pattern on the sheet surface with the interconnection paste.
(6) Laminating these sheets with interconnection patterns together under pressure.
(7) Heat treating the resulting laminate.

In the above-mentioned heat treatment process, the organic binder in the laminate and the organic substance in the interconnection paste decompose and are thus eliminated. At the same time, the inorganic material in the laminate which is in a powdered state of aggregation and the conducting metal in the conducting paste are sintered and become finer.

However, if the organic binder remains in the sintered compact, it will be converted to graphite, and the quality of the substrate and wiring after sintering will deteriorate. For this reason, sufficient binder removal time is generally allowed in the sintering step, followed by a sintering period which has the main purpose of increasing the fineness.

This classical type of heat treatment profile is disclosed in Japanese Patent Laid-Open No. Hei 8-18232, etc. The binder is removed in an atmosphere at about 800° C. for 15 hours, and the product is kept in an atmosphere at about 1000° C. for 2 hours for sintering. Water vapor etc. is usually added to the processing atmosphere during the above-mentioned binder removal.

However, when copper is used for the metallic material of the conductor, although sintering of the copper takes place starting from approximately 600° C., sintering of the glass ceramics itself begins at a higher temperature. This difference of sintering start times may causes serious problems in the substrate, particularly in the conductor or at the interface between the conductor and the ceramics, so in the case of copper paste, an attempt is often made to adjust the sintering start temperature of the ceramics.

As an example, a copper paste mixed with alumina of particle size 0.1 $\mu$m to 1 $\mu$m is disclosed by Japanese Patent Publication 2584911. Also, a copper paste comprising copper oxide and glass frit is disclosed by Japanese Patent Laid-Open No. Hei 8-279666.

SUMMARY OF THE INVENTION

In producing a multilayer wiring board using the above-mentioned green sheet method, in the case of an alumina and copper mixture, it is difficult to disperse fine alumina of particle size less than 1 $\mu$m in the copper paste. For this reason, it is difficult to obtain desired paste printing properties required for processes such as embedding interconnection paste in vias, or forming interconnections or other patterns.

Moreover, copper oxide tends to discharge copper ions in the glass, and may produce a fine copper colloid in the ceramics depending on the firing conditions. This causes deterioration of the insulating properties of the ceramics, and decreased hardness.

On the other hand, as the microinterconnections are formed and via diameters reach about 50 $\mu$m, a new problem may arise in addition to the above-mentioned difference of sintering start temperature. Specifically, if copper particles grow very large during their growth when the substrate is fired, they will reach a size of the same order as that of the via diameter. As a result, after sintering, vias will be formed of several enlarged copper particles, particle interfaces will break down due to the effect of subsequent heat cycles, and breaks will tend to occur in the via interconnections. Moreover, there is also the disadvantage that via interconnections may fall out of the via holes of the ceramic substrate.

As an example of one way of dealing with this copper particle diameter problem after sintering, a copper paste mixed with aluminum acid which generates alumina of sub-micron size in the sinter is disclosed in Japanese Patent Laid-Open No. Hei 8-17217. However, as water vapor is generated simultaneously during the alumina forming reaction, more voids than needed were produced in the copper interconnections.

This invention aims to overcome the disadvantages of the prior art by suppressing the size of copper particles in the via to 20 $\mu$m or less, thereby reducing breaks in interconnections due to fractures at interfaces of copper particles which grow during sintering, and reducing the risk of fractured vias separating from the ceramic substrate.

To achieve this objective, alumina having an average particle size of 1 $\mu$m to 4 $\mu$m was distributed in sintered copper at an interval of 7.4 $\mu$m or less in terms of the average distance between particle centers.

The reason why the copper particles grow large during sintering is that the copper particle boundaries migrate through the copper, fusing with the surface of the sinter body or with other copper particle boundaries, and this leads to a decrease of copper particle interfaces in the sintered copper.

By distributing alumina of average particle size 1 $\mu$m to 4 $\mu$m in the sintered copper at the aforesaid interval, the copper boundaries can no longer migrate, the copper interfaces do not decrease even at the high temperature of the sintering step, and the copper particles remain in a fine state of division. As a result enlargement of copper particles is prevented, and fractures of via interconnections do not occur.

The inventors experimentally verified that migration of particle boundaries in sintered copper was inhibited by alumina particles having the aforesaid size in restricted shapes such as vias. The details of these experiments will now be described.

The test substrate was an ordinary glass ceramic substrate having vias of diameter 60 μm and comprising 10–40 layers, these layers being laminated so that the vias were vertically connected with each other right through the substrate from one surface to the other. It should be noted that the number of layers in the substrate is not limited to the above, and it may comprise only one layer.

Next, after sintering this substrate under sintering conditions known in the art, it was cut so that the center line of the via appeared on the surface. The cut surface was polished by the ordinary method, and then etched so that the copper particle boundaries could be clearly seen.

Next, for 500 or more vias observed in this cut surface, the shapes of the copper particle boundaries therein were read by a computer, and these shapes were accurately traced so as to calculate the surface area of the copper particles.

The reason why, in evaluating the state of the via interconnections formed inside the vias, the surface area of the copper particles was used as a parameter instead of the diameter which has usually been used in the past, is as follows.

In general, when a particle grows in a shape like a via, the shape often has an aspect ratio largely different from 1, and if the shape is assumed to be a circle, it is difficult to evaluate the copper particles precisely. The inventors also considered not only the average size of a particle, but also the maximum size. This is because in considering enlargement reactions of particles, when there are several thousand vias in the substrate, it is difficult to assess the quality of the vias using only a simple average. However, in this experiment, the surface area of each copper particle in the observed via cross-section was measured and recorded.

It was found that when the diameter of the via is 60 μm, if the cross sectional area of a copper particle exceeds 2000 μm², the copper particle interface will be formed from one side edge to the other side edge of the via cross-section, and as all the particles having a cross-sectional area exceeding 3000 μm² cut across the via cross-section, there is a very strong possibility that particles having this cross-section will lead to fracture of the via.

Therefore, the via was filled with a paste of copper particles of diameter 0.5 μm to 6 μm with the objective of making the cross-sectional area of all the copper particles in the via, 2000 μm². The variation of particle diameter during the sintering step was observed.

FIG. 1 shows the change in the average value and maximum value of copper particle cross-sectional area in the sintering step. As a result, the average value of the copper particle cross-sectional area after processing for 10 hours in an atmosphere at 850° C. at which point binder removal is complete was 50 μm², and the maximum value within the observed range was 1000 μm². When 1000° C. was reached, the cross sectional area of a copper particle was 270 μm², and the maximum value was 5000 μm². Also, at 1000° C., the average and maximum values of the cross sectional area of copper particles increased with the heating time. In an atmosphere at 950° C., the average value was 250 μm² and the maximum value was 5000 μm² when left for 2 hours.

Hence, after binder removal, a significant increase in the cross-sectional area of copper particles was found, and especially at temperatures higher than 950° C. The change of particle cross-sectional area in the process occurs mostly in this temperature region, but considering the behavior of the maximum particle cross-sectional area, it was clear that the particle size must be controlled from a temperature lower than 950° C.

Next, FIG. 2 shows the variation of the cross sectional area of the copper particles in the via in a paste wherein alumina is added to the copper. The results apply to the case when the mean particle diameter of the added alumina is 1 μm, 2 μm and 4 μm, and the addition amount was varied from 2 vol % to 10.5 vol % relative to the inorganic substance in the via.

It is clear from these results that, for all alumina particle sizes from 1 μm to 4 μm, the cross-sectional area of copper particles can be markedly decreased by adding alumina. However, the decrease does not much depend on the addition amount of alumina particles, the average value of cross-sectional area lying in the range 100 μm²–200 μm² and the maximum value lying in the range 500 μm²–1500 μm² whatever the addition amount and particle size of alumina.

FIG. 3 shows the structure seen when observing the via cross-section. When alumina is added, as shown in FIG. 3A, alumina 4 is present at the boundaries of copper particles 31 or in regions where the copper particles 31 overlap (multiple points). The copper particles are much finer than in the case shown in FIG. 3B, where alumina is not added. Moreover, there are no longer any particles which span the whole via from one side edge to the other side edge of the via cross-section, as shown in FIG. 3B.

Thus, by adding the alumina 4 having a particle size which is easily dispersed in copper paste, the alumina 4 inhibits particle boundary migration of the copper particles 31, and therefore prevents enlargement of the copper particles.

The reason why the copper particle boundary stops in the vicinity of the alumina is that the interface energy of the copper changes near the alumina, as shown in FIG. 4.

Consider the case where a particle boundary 42 migrates from a position 1 to a position 3 in the copper 41, and there are alumina particles 43 at an intermediate position 2, as shown in FIG. 4A. When the particle boundary 42 arrives at this position 2, the cross-sectional area of the boundary 42 decreases by an amount corresponding to the cross-sectional area Sb of the alumina 43, as shown in FIG. 4B.

At the same time, an interface Sa is formed between the copper 41 and the alumina 43. Hence, if there is a large difference of interface energies between copper particles and between copper particles and alumina particles, the interface energy of the particle boundary 42 will either become very large or will vary at the position 2 (FIG. 4C).

The change ΔE of interface energy per alumina particle may be expressed by the following equation.

$$\Delta E = Sb \cdot Ecc - Sa \cdot Eca \quad (1)$$

where

Sa=interfacial area between copper and alumina,

Sb=cross-sectional area of alumina,

Ecc=energy per unit cross-sectional area of copper-copper interface,

Eca=energy per unit cross-sectional area of copper-alumina interface

Substances which cause this change of interface energy are not limited to alumina. This is because, if their interface energy is different from the interface energy between copper and copper, the energy at position 2 shows an extreme value whether the energy difference is positive or negative.

When the change ΔE of this energy is larger than the energy which moves the boundary surface 42, the boundary surface 42 cannot move past the alumina 43. It moves inside the sintered compact at the same speed as the alumina 43, but as the speed of movement of the alumina 43 in the sintered compact is itself small, the movement of the boundary surface 42 is consequently impeded by the alumina 43.

It may therefore be said that a more correct understanding of this phenomenon could be achieved by considering the relation between numbers of alumina particles and interface surface area rather than by considering the relation between alumina concentration and copper particle cross-sectional surface area or particle diameter.

The inventors measured the particle boundary length Lg corresponding to the cross-sectional area A of a measured copper particle, and calculated a copper particle boundary surface area Sgv in one via. Sgv was calculated by multiplying the particle boundary surface area Sv per unit volume of a crystalline substance, given by equation 2 below, by the volume of a via which is the subject of this experiment.

$$Sv = (4/\pi) \cdot Lg/A \qquad (2)$$

Here, Lg is the particle boundary line length appearing in the observed surface area, and A is the observed surface area.

Equation 2 is widely supported by researchers in the field, and is for example reported in "Ceramic Processing" by Mizutani, Ozaki, Kimura and Yamaguchi (Gihodo, 1985).

FIG. 5 shows the result of plotting the copper particle boundary surface area Sgv in the aforesaid via against the number of alumina particles in the via computed from the alumina concentration. The plotted data can be approximated using a straight line of slope 43 (1000 $\mu m^2$/1000). This means that a migration of a 43 $\mu m^2$ particle boundary surface area can be prevented per alumina particle, and if this region is assumed to be a circle, it is equivalent to a diameter range of 7.4 $\mu$m.

From the above discussion, the minimum amount of alumina required to suppress the migration of a copper particle boundary, or in other words, the enlargement of a copper particle in the via, can also be computed. Specifically, this value means that alumina particles are distributed in the via at an interval of 7.4 $\mu$m.

It is known that in a particle disperse system, equation 3 shown below holds between the average value λ of the distance between the nearest particles and the particle number density Nv (for example, R. T. DeHoff, F, N. Rhines et al, "Measurement Morphology", Rogakuo Uchida (1983), etc., translated by Makishima, Shinohara and Komori). From this, if λ=7.4 $\mu$m, Nv may be calculated to be 4.2× $10^{-4}$(/$\mu m^3$).

$$\lambda = 0.554/(N v^{1/3}) \qquad (3)$$

As stated above, it is not additive concentration but the number density of added particles and their interval which are the essential points of this invention. The above measurements were made in order to understand the phenomenon, and require a great amount of effort. In practice, the volume of additive will probably be computed and manufacturing carried out to obtain the desired interval and number density, so the relation of the number density Nv of addition particles and volume % of added particles such as alumina is given as equation 4. In this equation 4, it is assumed that the added particles are spherical. Moreover, if the required minimum number densities 4.2×$10^{-4}$ (/$\mu m^3$) are given as examples for particles of diameter 1 $\mu$m, 2 $\mu$m, 4 $\mu$m, the corresponding volumes are respectively 0.022, 0.18, 1.4 volume %.

$$C = 100 \ (\pi/6) \cdot d^3 \cdot Nv \qquad (4)$$

Here, C is the volume % in the via of an added particle, d is the diameter of the added particle, and Nv is the particle number density.

BRIEF DESCRIPTION OF THE DRAWINGS

These and other features, objects and advantages of the present invention will become more apparent from the following description when taken in conjunction with the accompanying drawings wherein:

FIG. 3 is a figure which shows the cross-sectional structure of via copper particles after sintering.

DETAILED DESCRIPTION OF PREFERRED EMBODIMENTS

Hereafter, the embodiments will be described referring to the figures and tables.

Figure 1A:
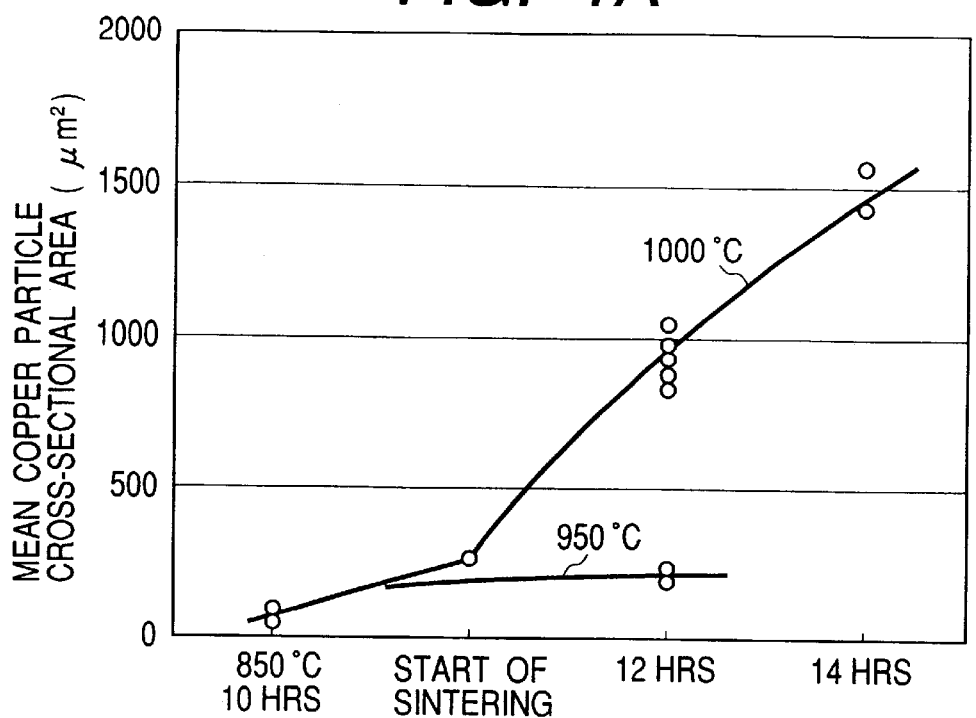
FIG. 1 is a figure which describes the cross-sectional area variation (average value and maximum value) of via copper particles in the sintering step in this embodiment.
Figure 1B:
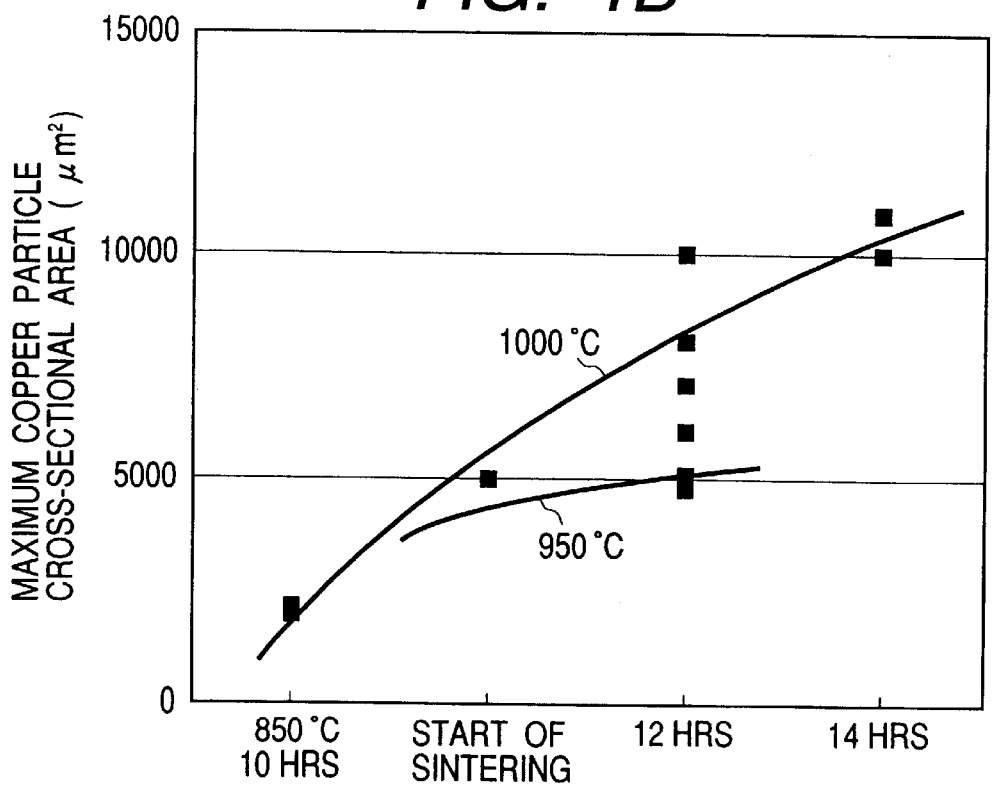
Figure 2A:
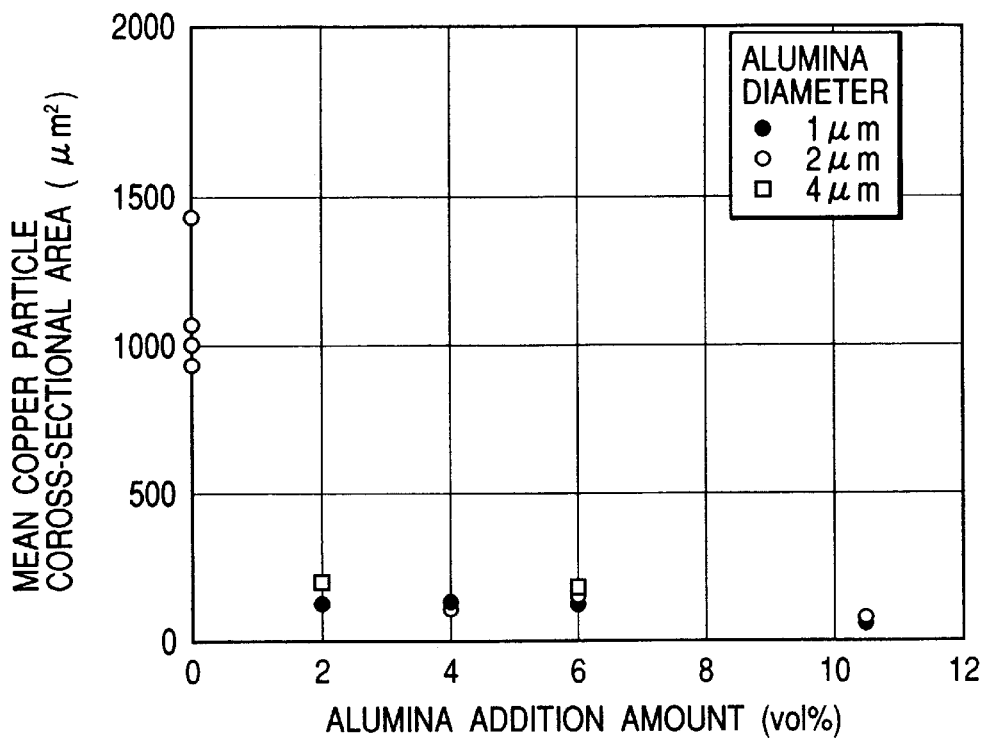
FIG. 2 is a figure which describes the cross-sectional area variation (average value and maximum value) of via copper particles after sintering relative to an added alumina concentration.
Figure 2B:
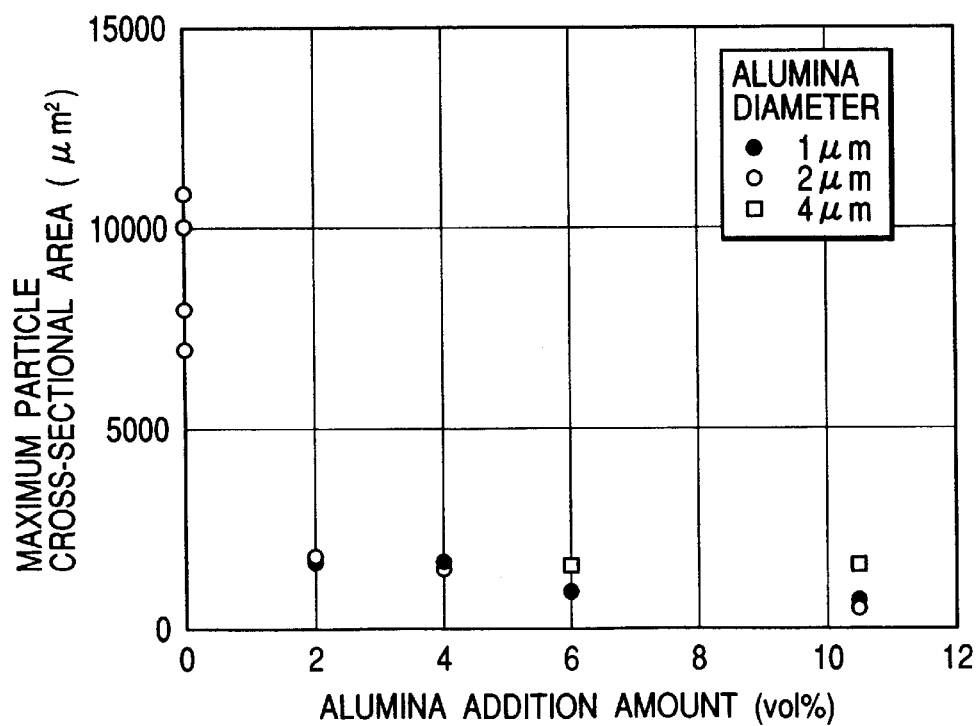
Figure 3A:
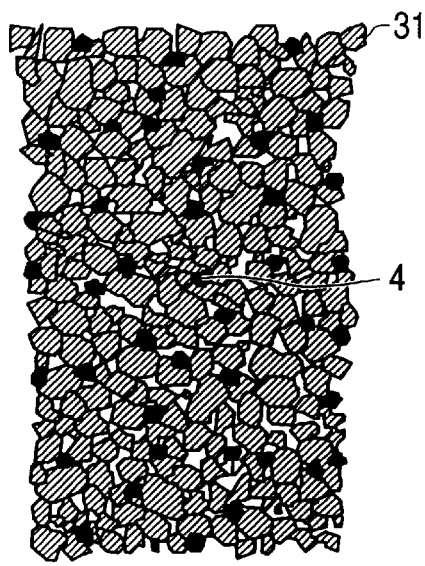
FIG. 3A is the case when alumina is added.
Figure 3B:
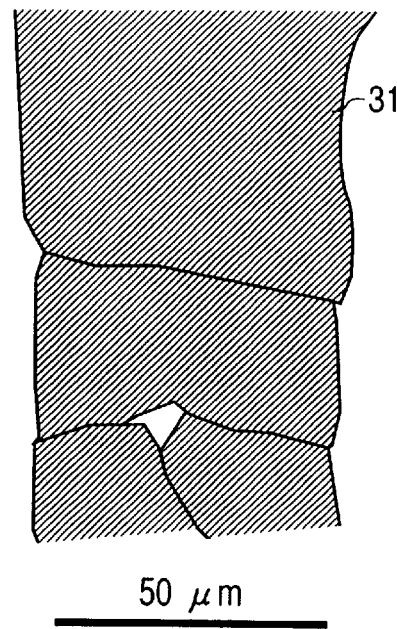
FIG. 3B is the case where alumina is not added.
Figure 5:
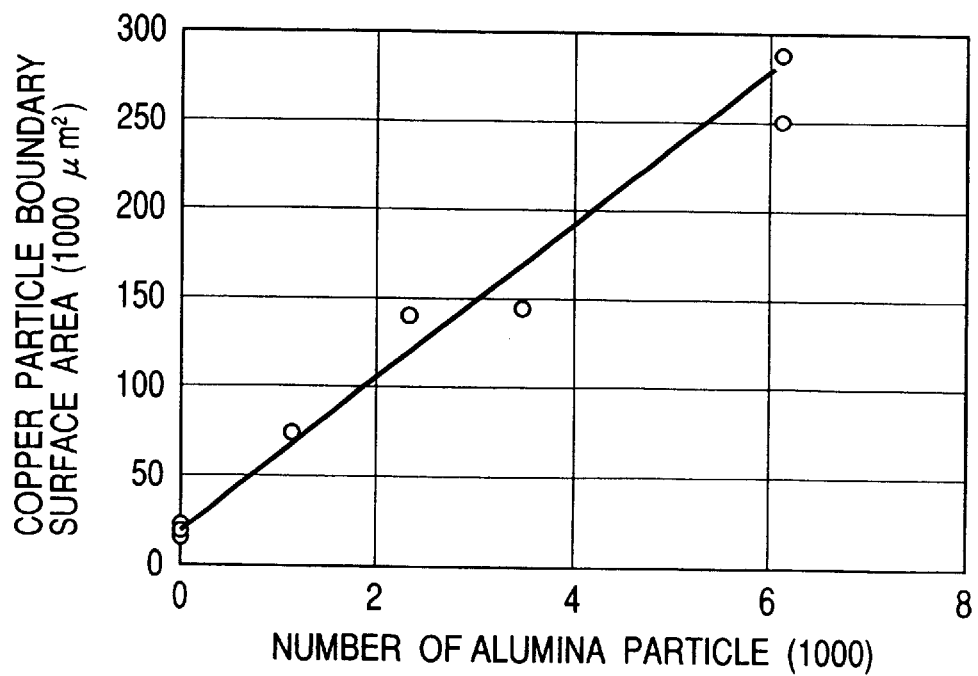
FIG. 5 is a figure showing change of copper particle boundary surface area relative to alumina particle number in a via after sintering.
Figure 4A:
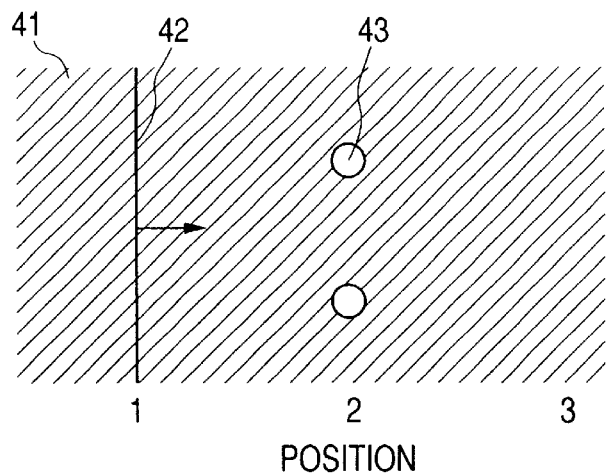
FIG. 4 is a figure for describing the energy change when a particle interface migrates in a copper sintered compact.
Figure 4B:
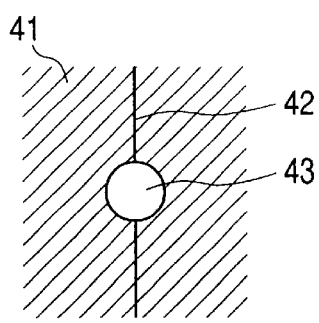
Figure 4C:
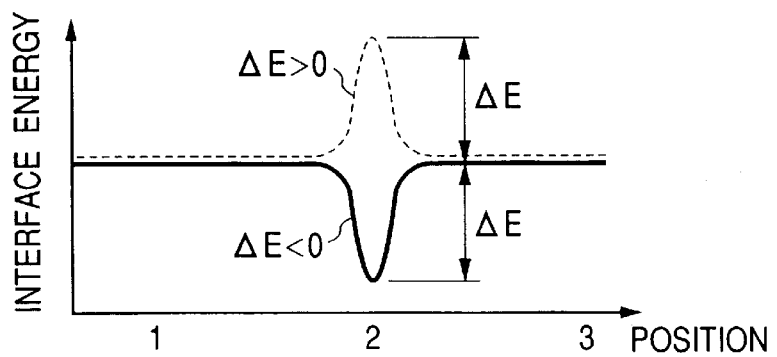
Figure 6:
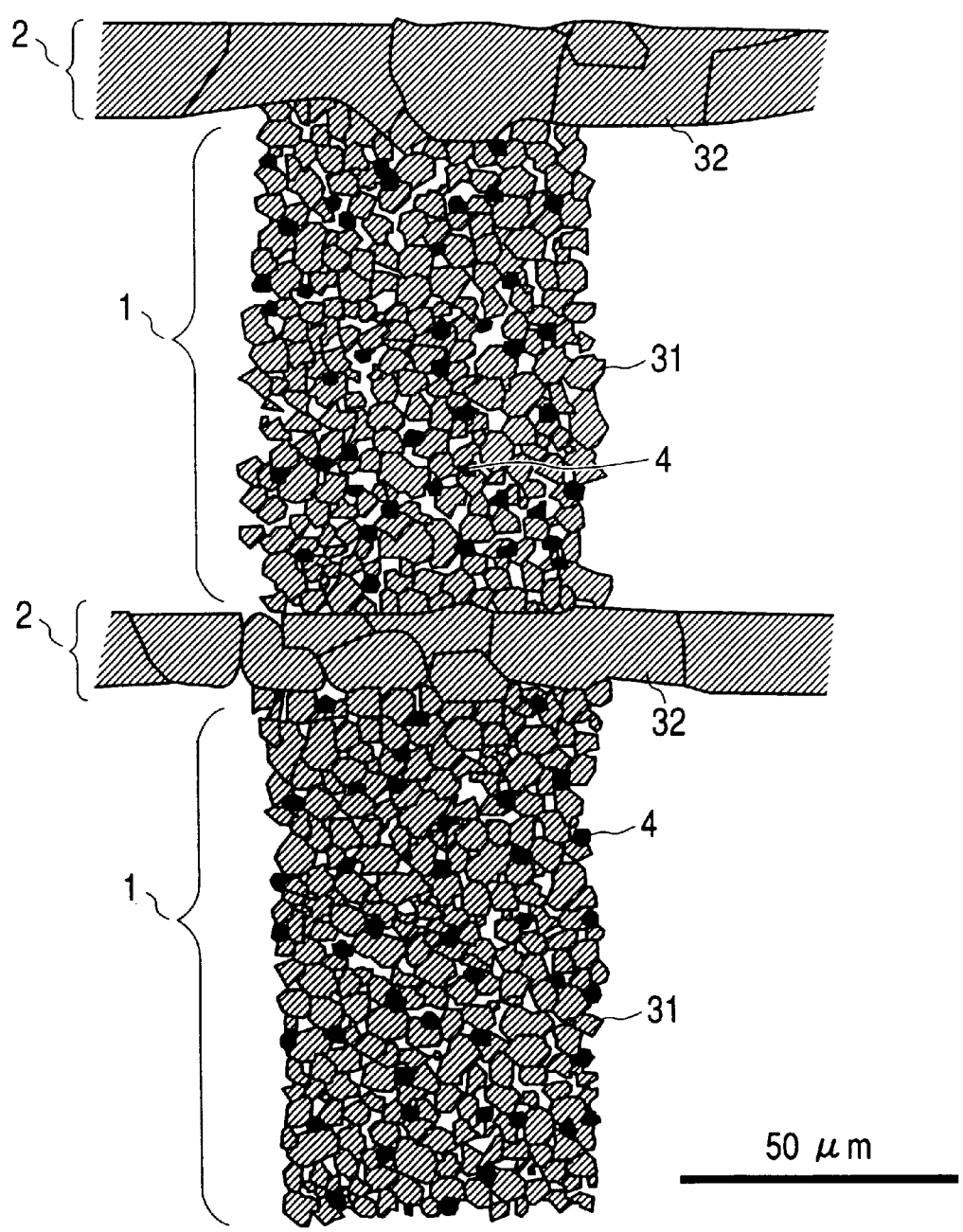
FIG. 6 is a figure which describes the state in the via after sintering according to this embodiment.

FIG. 6 shows the method of manufacturing a multilayer substrate having a via cross-sectional microstructure shown in FIG. 6. The manufacturing process used the ordinary green sheet method. The green sheet itself was manufactured from a slip having the composition shown in the following Table 1 using the doctor blade method known in the art.

TABLE 1

| Composition | Weight % |
|---|---|
| glass powder | 22.4 |
| mullite | 27.6 |
| water | 33.8 |
| isopropyl alcohol | 8.0 |
| dispersants | 0.1 |
| binders | 8.1 |

The thickness of the green sheet described above was about 200 $\mu$m. The composition of the glass is shown in Table 2.

Both the glass and mullite had particle diameters of 3 μm.

TABLE 2

| composition weight % | SiO$_2$ | B$_2$O$_3$ | Al$_2$O$_3$ | Na$_2$O |
|---|---|---|---|---|
| | 80 | 13 | 3 | 4 |

As a reference example, the glass was manufactured using a composition disclosed in Japanese Patent Laid-Open No. Hei 8-333157, and the green sheet was manufactured using a composition disclosed in Japanese Patent Laid-Open No. Hei 6-227855. This showed that a via having the characteristics of this embodiment could be formed even if the composition of the glass or green sheet was changed, and therefore, the composition of the glass and green sheet does not impose a limitation on the manufacturing method of this embodiment.

Next, a via 1 of diameter 60 μm was opened in the aforesaid green sheet using a hole opening tool (commonly referred to as a punch).

This via was then filled with paste. One example of the paste used in this embodiment was obtained by adding 2.6 g of the alumina powder 4 of 2.1 μm mean particle diameter to 100 g of a mull substance comprising 92 vol % copper of 3 μm mean particle diameter in a vehicle comprising ethyl cellulose and 2, 2, 4-trimethyl-1,3-pentadiol monoisobutyrate in a ratio of 1:9. Next, 1.75 g of ethyl cellulose of viscosity 300000 mPa/s was added so that the viscosity was, for example, about 400000 to 500000 mPa/s, the product was blended for about 60 minutes using a tub paddle machine known in the art, and the resulting mixture was homogenized in an ordinary vibrating stirrer.

Next, the aforesaid paste was embedded in the via 1 of diameter 60 μm according to the criteria for screen-stencil. After filling the via with the paste, a predetermined intrasurface interconnection 2 was printed on this sheet using copper paste. This operation was repeated, and the resulting laminate of 25 layers was stuck together under pressure at 130° C.

In sintering the laminate, as an example, it was kept for approximately 10 hours in an atmosphere at 850° C. while the temperature was increased at a rate of 100° C./hour 10 hours, left for 2 hours in an atmosphere at 1000° C., and cooled at an average rate of 200° C./hour. When the laminate was kept for approximately 10 hours in an atmosphere at 300° C. to 850° C. during the aforesaid temperature raising step, operations were performed in an atmosphere of water vapor comprising nitrogen at 0.4 atmospheres in terms of partial pressure, and in an atmosphere of pure nitrogen at other times.

After subjecting the substrate produced by the abovementioned method to various tests, the substrate was cut and the state of the via 1 was confirmed. In particular, it was verified that no fatal abnormalities such as disconnection of vital interconnections occurred in the laminated substrate even if a load of 3000 or more cycles were applied in a −50° C./150 heat cycle test.

FIG. 6 shows a schematic view of the via 1 in this embodiment. It should be noted the boundary lines of copper particles do not appear clearly if the substrate is merely cut and its cross-section polished, therefore it was immersed for several seconds in an etching fluid comprising water, 28% ammonia, and 3% aqueous hydrogen peroxide in a ratio of 50:50:1 by volume.

The via 1 was thus formed so that the interconnections 2 within the surface were connected between layers. The copper particles 31 in the via were finer than the copper particles 32 in the surface interconnections. Further, in the via 1, the alumina 4 was present at the boundaries of the copper particles 31 or in regions where the particle boundaries overlapped (multiple points), but were not present inside the copper particles 31.

The cross-sections of more than about 100 of the vias 1 were observed, and of the copper particles 31 in the vias 1, none were found to have a cross-sectional area exceeding 1500 μm$^2$. No cracks were observed in the vias 3. When a chemical analysis was performed on this via 1, the proportions of the copper 31 and alumina 4 were respectively 94.1 and 5.9 in terms of volume %.

Other compositions different from the above were manufactured as pastes filling the vias by the same manufacturing method as that of this embodiment, and the same effect was obtained. Specifically, the compositions of the pastes filling the vias were obtained as follows. The alumina powder 4 of 2.1 μm mean particle diameter was added, together with ethyl cellulose of viscosity 300000 mPa/s, to 100 g of a mull substance comprising 92 vol % copper of 3 μm mean particle diameter in a vehicle comprising ethyl cellulose and 2,2,4-trimethyl-1,3-pentadiol monoisobutyrate in a ratio of 1:9. In paste (a), the addition amount of ethyl cellulose was 0.55 g, in paste (b), the addition amount of ethyl cellulose was 4.8 g and in paste (c), the addition amount of ethyl cellulose was 3.21 g. In all of the above via filling pastes (a), (b), (c), the state of the vias 1 after sintering was identical to that shown in FIG. 6 of this embodiment, and none of the copper particles 31 in the via had a cross-sectional surface area exceeding 1500 μm$^2$.

It was moreover verified by chemical analysis that the vias 1 which had been filled with one of the via filling pastes (a), (b) or (c) and sintered, respectively contained 2.0, 4.1, 10.5 of the alumina 4 in terms of volume %.

As described above, if dispersible alumina particles of suitable size are mixed with a paste of copper particles, and the result is used to fill vias in a substrate and sintered, the sizes of the copper particles in the vias do not grow as large as the via diameter. Even if a load of 3000 or more −50° C./150° C. heat cycles is applied, it does not cause breaks in interconnections due to fracture at copper particle interfaces. Also, the problem of broken vias falling out of ceramic substrates is thereby largely resolved.

Consequently, it was possible to construct a ceramic wiring board having a multilayer structure having high reliability in application to electronic instruments requiring a high degree of integration and high-speed processing.

While we have shown and described several embodiments in accordance with our invention, it should be understood that the disclosed embodiments are susceptible of changes and modifications without departing from the scope of the invention. Therefore, we do not intend to be bound by the details shown and described herein, but intend to cover all such changes and modifications that fall within the ambit of the appended claims.

We claim:

1. A glass-ceramic wiring board comprising an insulating substrate, a via disposed in said insulating substrate, a via interconnection filling the interior of said via, and a circuit interconnection provided above said insulating substrate, wherein a metal oxide having a mean particle diameter of from 1 μm to 4 μm is disposed at an average interval of 7.4 μm or less in the interior of said via interconnection after sintering.

2. A glass-ceramic wiring board according to claim 1, wherein said via interconnection filling said via is comprised of copper, and said metal oxide is comprised of alumina particles.

3. A glass-ceramic wiring board defined in claim 1, wherein said metal oxide is disposed in the interior of said via interconnection after sintering at a number density of at least $4.2 \times 10^{-4}$ $(/\mu m^3)$.

4. A glass-ceramic wiring board comprising an insulating substrate, a via disposed in said insulating substrate, a via interconnection filling the interior of said via, and a circuit interconnection provided above said insulating substrate, wherein said insulating substrate is laminated so that said circuit interconnection and said via interconnection are connected, and a metal oxide having a mean particle diameter of from 1 $\mu$m to 4 $\mu$m is disposed at an average interval of 7.4 $\mu$m or less in the interior of said via interconnection after sintering.

5. A glass-ceramic wiring board according to claim 4, wherein said via interconnection filling said via is comprised of copper, and said metal oxide is comprised of alumina particles.

6. A glass-ceramic wiring board defined in claim 4, wherein said metal oxide is disposed in the interior of said via interconnection after sintering at a number density of at least $4.2 \times 10^{-4}(/\mu m^3)$.

7. A method of manufacturing a multilayered circuit board, comprising the steps of:

forming a sheet-like insulating substrate, forming a via (through hole) in said substrate, forming a conductor interconnection paste comprising at least a conductor and a metal oxide, embedding said conductor interconnection paste in the interior of said via so as to form a via interconnection, forming a conductor interconnection on the surface of said substrate, laminating said substrate on which said conductor interconnection is formed, and subjecting the resulting laminate to pressure, and heat-treating said laminate which has been subjected to pressure, wherein:

said conductor interconnection paste is formed such that a metal oxide having a mean particle diameter of from 1 $\mu$m to 4 $\mu$m is disposed at an average interval of 7.4 $\mu$m or less in the interior of said via interconnection after sintering.

8. A manufacturing method according to claim 7, wherein said conductor interconnection paste is formed so that a metal oxide having a mean particle diameter of from 1 $\mu$m to 4 $\mu$m is contained in the interior of said via interconnection after sintering at a number density of at least $4.2 \times 10^{-4}$ $(/\mu m^3)$.

9. A manufacturing method defined in claim 7 or 8, wherein said conductor is comprised of copper particles, and said metal oxide is comprised of alumina particles.

* * * * *